(12) United States Patent
Shim et al.

(10) Patent No.: US 6,256,260 B1
(45) Date of Patent: Jul. 3, 2001

(54) SYNCHRONOUS SEMICONDUCTOR MEMORY DEVICE HAVING INPUT BUFFERS AND LATCH CIRCUITS

(75) Inventors: Young-Bo Shim; Woo-Soon Kang, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/570,729

(22) Filed: May 12, 2000

(30) Foreign Application Priority Data

May 13, 1999 (KR) .................................................. 99-17135

(51) Int. Cl.[7] ...................................................... G11C 8/00
(52) U.S. Cl. ................ 365/233; 365/189.05; 365/230.08
(58) Field of Search ............................... 365/233, 189.05, 365/230.08, 189.01, 230.01

(56) References Cited

U.S. PATENT DOCUMENTS

| | | | |
|---|---|---|---|
| 5,521,878 | 5/1996 | Ohtani et al. | 365/233 |
| 5,812,490 | 9/1998 | Tsukude | 365/233 |
| 5,812,492 | 9/1998 | Yamauchi et al. | 365/233.5 |
| 5,838,630 | 11/1998 | Okajima | 365/233 |
| 5,880,998 | 3/1999 | Tanimura et al. | 365/189.05 |
| 5,923,613 | 7/1999 | Tien et al. | 365/233 |
| 5,933,379 | 8/1999 | Park et al. | 365/201 |
| 5,963,501 | 10/1999 | Lee et al. | 365/233 |

FOREIGN PATENT DOCUMENTS

| | | | |
|---|---|---|---|
| 1-227296 | 9/1989 | (JP) | G11C/11/34 |
| 09172255 | 6/1997 | (JP) | G11C/11/407 |
| 09218604 | 8/1997 | (JP) | G11C/11/407 |
| 09347767 | 12/1997 | (JP) | G11C/11/407 |
| 09349832 | 12/1997 | (JP) | G11C/11/407 |

Primary Examiner—David Nelms
Assistant Examiner—Hoai V. Ho
(74) Attorney, Agent, or Firm—Jacobson, Price, Holman & Stern, PLLC

(57) ABSTRACT

A synchronous semiconductor memory device having a plurality of external signal input buffer and a plurality of latch circuits, includes: a clock buffer for receiving an external clock signal to generate a buffered clock signal; a chip select buffer for receiving an external chip select signal and the buffered clock signal from said clock buffer to generate a buffered chip select signal, an inverted buffered chip select signal and a latch control signal, wherein the latch control signal is activated when the external clock signal is at the rising edge and the external chip select signal is low; a plurality of external signal buffers for receiving external signals to generate buffered signals and inverted buffered signals; and a plurality of latch circuits for latching and outputting the buffered signals and the inverted buffer signals to an internal logic circuit in response to the latch control signal.

19 Claims, 9 Drawing Sheets

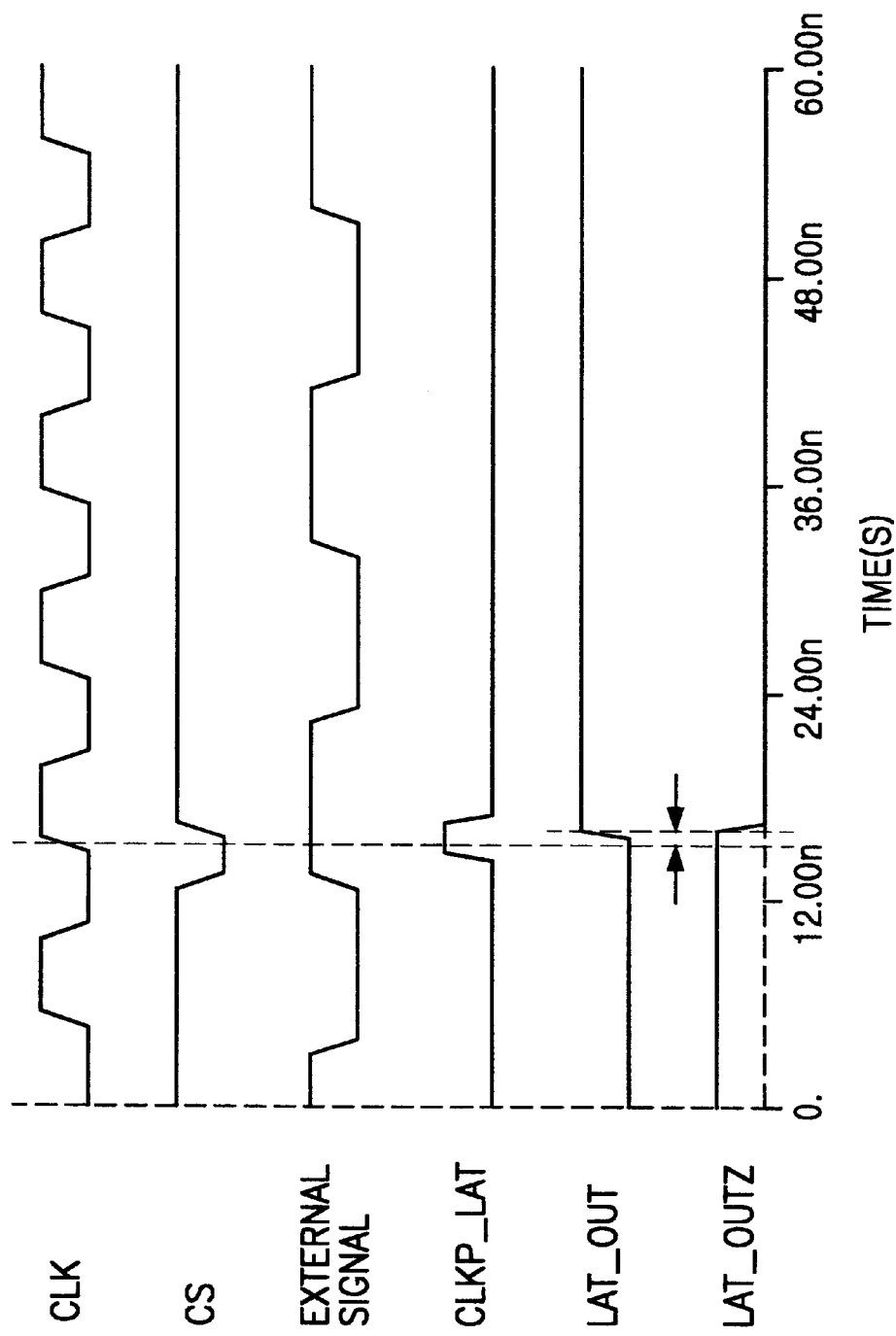

SYNCHRONOUS SEMICONDUCTOR MEMORY DEVICE HAVING INPUT BUFFERS AND LATCH CIRCUITS

FIELD OF THE INVENTION

The present invention relates to a semiconductor memory device; and, more particularly, to a synchronous semiconductor memory device having external signal input buffers and latch circuits, capable of improving an operational speed thereof and reducing power consumption.

DESCRIPTION OF THE PRIOR ART

For achieving a high speed of operation in a semiconductor memory device, synchronous semiconductor memory devices have been developed. The synchronous semiconductor memory device operates in synchronization with an external cock signal. The synchronous semiconductor memory device includes a synchronous dynamic random access memory (SDRAM), a single data rate (SDR) SDRAM, a double data rate (DDR) SDRAM and the like.

Generally, a synchronous semiconductor memory device includes a plurality of external signal input buffers and latch circuits. The external signal input buffers receives external signals to generate internal signals which can be used within the semiconductor memory device. The latch circuits latches and outputs the internal signals to the internal circuits.

A clock buffer, one of the external signal input buffers, receives an external clock signal to output a buffered clock signal and an internal clock signal generator generates an internal clock signal in response to the buffered clock signal. Other external signal input buffers receive external signals to output buffered signals. Then, the latch circuits latch and output the buffered signals, as internal signals, from the external signal input buffers to the internal logic circuits in response to the internal clock signal. Therefore, the synchronous semiconductor memory device operates in synchronization with the internal clock signal.

Hereinafter, conventional input buffers and latch circuits used in a synchronous semiconductor memory device are described with reference with FIGS. 1 and 2.

Referring to FIG. 1, a clock buffer 100 receives an external clock signal CLK to output a buffered clock signal, and an internal clock generator 102 generates an internal clock signal CLK_PULSE in response to the buffered clock signal.

A plurality of external signal input buffers 104, 106A to 106C and 108A to 108D receive respective external signals to output buffered signals having a predetermined level which can be used in internal logic circuits. Here, the external signals includes a chip select signal CS, a row address strobe signal RAS, a column address strobe signal CAS, a write enable signal WE, and external address signals ADD<0> to ADD<N>. For example, a CS buffer 104 receives an external chip select signal CS to output a buffered chip select signal and an inverted chip select signal.

Then, the latch circuits 110A to 110N latches and outputs each buffered signal and inverted buffered signal in response to the internal clock signal CLK_PULSE from the internal clock generator 102. Here, a reference numeral CS_OUT, for example, represents an internal chip select signal synchronized with the internal clock signal CLK_PULSE, and CS_OUTZ an inverted internal chip select signal.

FIG. 2 is a timing chart of signals shown in FIG. 1. A reference numeral LAT_OUT represents an output signal from one latch circuit, synchronized with the internal clock signal CLK_PULSE, LAT_OUTZ an inverted output signal from the latch circuit, synchronized with the internal clock signal CLK_PULSE. The external signal includes a chip select signal CS, a row address strobe signal RAC, a column address strobe signal CAS, a write enable signal, WE, and address signals ADD<0> to ADD<N>.

Referring to FIG. 2, in case where the external clock signal CLK is at a rising edge and the chip select signal CS is low, the internal clock signal CLK_PULSE is generated and the internal clock signal CLK_PULSE is applied to the latch circuits. The latch circuits latches and outputs the buffered signal LAT_OUT and the inverted buffered signal LAT_OUTZ, synchronized with the internal clock signal CLK_PULSE.

Although the buffered signals and the inverted buffered signals from the input buffers are transferred to the latch circuits, however, the buffered signals and the inverted buffered signals can not be transmitted to the internal logic circuits until the internal clock signal CLK_PULSE from the internal clock generator 102 is transmitted to each latch circuit. Therefore, the conventional semiconductor memory device has a disadvantage that an operating speed is reduced.

Furthermore, since the identical clock signal CLK_PULSE is subject to a level transition, e.g., rising edge or falling edge, of the external clock signal CLK, even after the external signals are transmitted to the internal logic circuits of the semiconductor memory device, the latch circuits 110A to 110N responsive to the internal clock signal CLK_PULSE are unnecessarily turned on and off in response to the external signals and the internal clock signal CLK_PULSE, thereby increasing an undesirable power consumption, as shown in section A of FIG. 2.

SUMMARY OF THE INVENTION

It is, therefore, an object of the present invention to provide a synchronous semiconductor memory device having external signal input buffers and latch circuits, in which the latch circuits are controlled by a latch control signal obtained by using the internal chip select signal from the chip select signal buffer, thereby decreasing a delay time required to transfer the external signals to an internal logic circuit and reducing an unnecessary power consumption.

In accordance with an aspect of the present invention, there is provided a synchronous semiconductor memory device having a plurality of external signal input buffer and a plurality of latch circuits, comprising: a clock buffer means for receiving an external clock signal to generate a buffered clock signal; a chip select buffer means for receiving an external chip select signal and the buffered clock signal from said clock buffer means to generate a buffered chip select signal, an inverted buffered chip select signal and a latch control signal, wherein the latch control signal is activated when the external clock signal is at the rising edge and the external chip select signal is low; a plurality of external signal buffer means for receiving external signal to generate buffered signals and inverted buffered signals; and a plurality of latch means for latching and outputting the buffered signals and the inverted buffer signals to an internal logic circuit in response to the latch control signal.

BRIEF DESCRIPTION OF THE DRAWINGS

Other objects and aspects of the invention will become apparent from the following description of the embodiments with reference to the accompanying drawings, in which:

FIG. 10 is a timing chart of signals shown in FIG. 3.

DETAILED DESCRIPTION OF THE PREFERRED EMBODIMENTS

Figure 1:
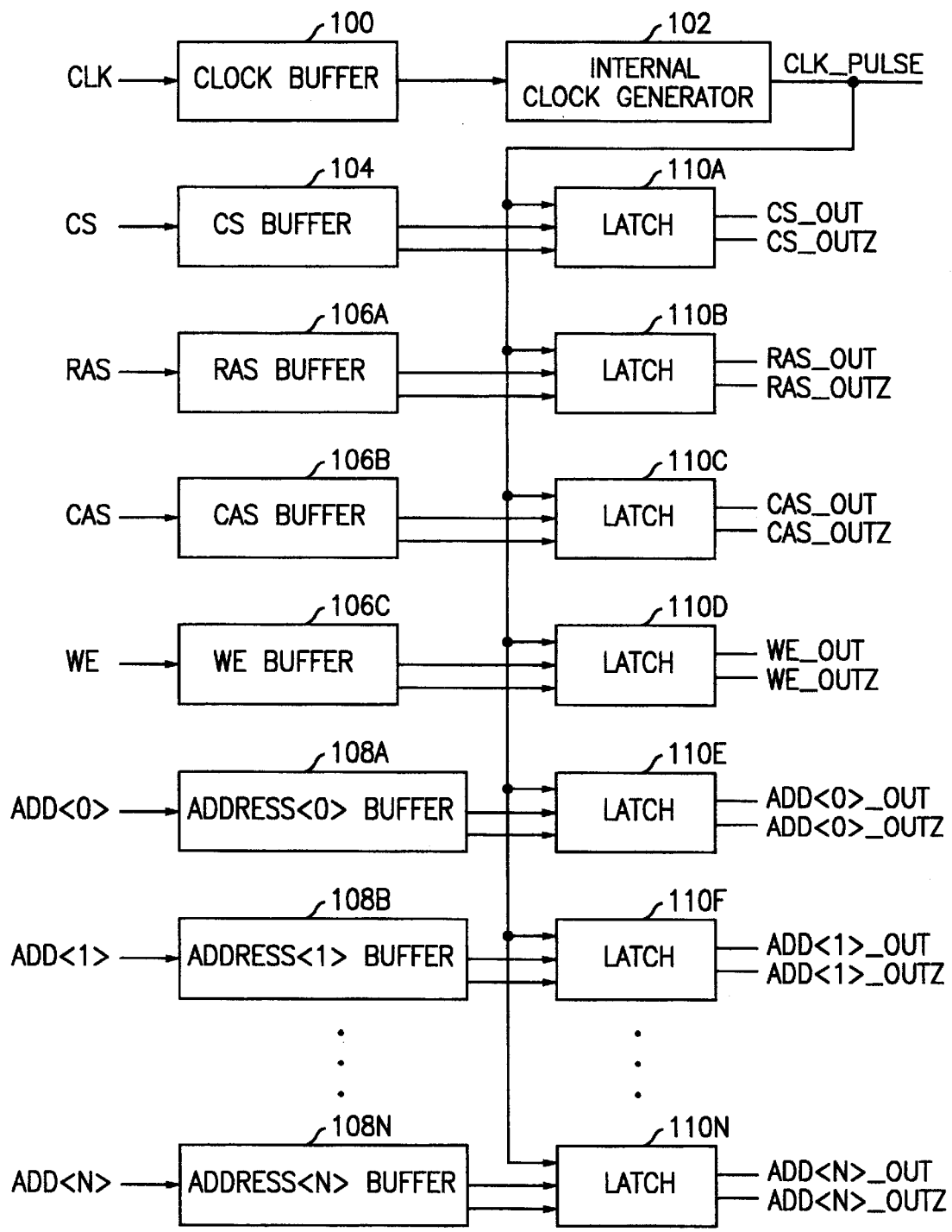
FIG. 1 is a block diagram illustrating conventional synchronous semiconductor memory device having input buffers and latch circuits.
Figure 2:
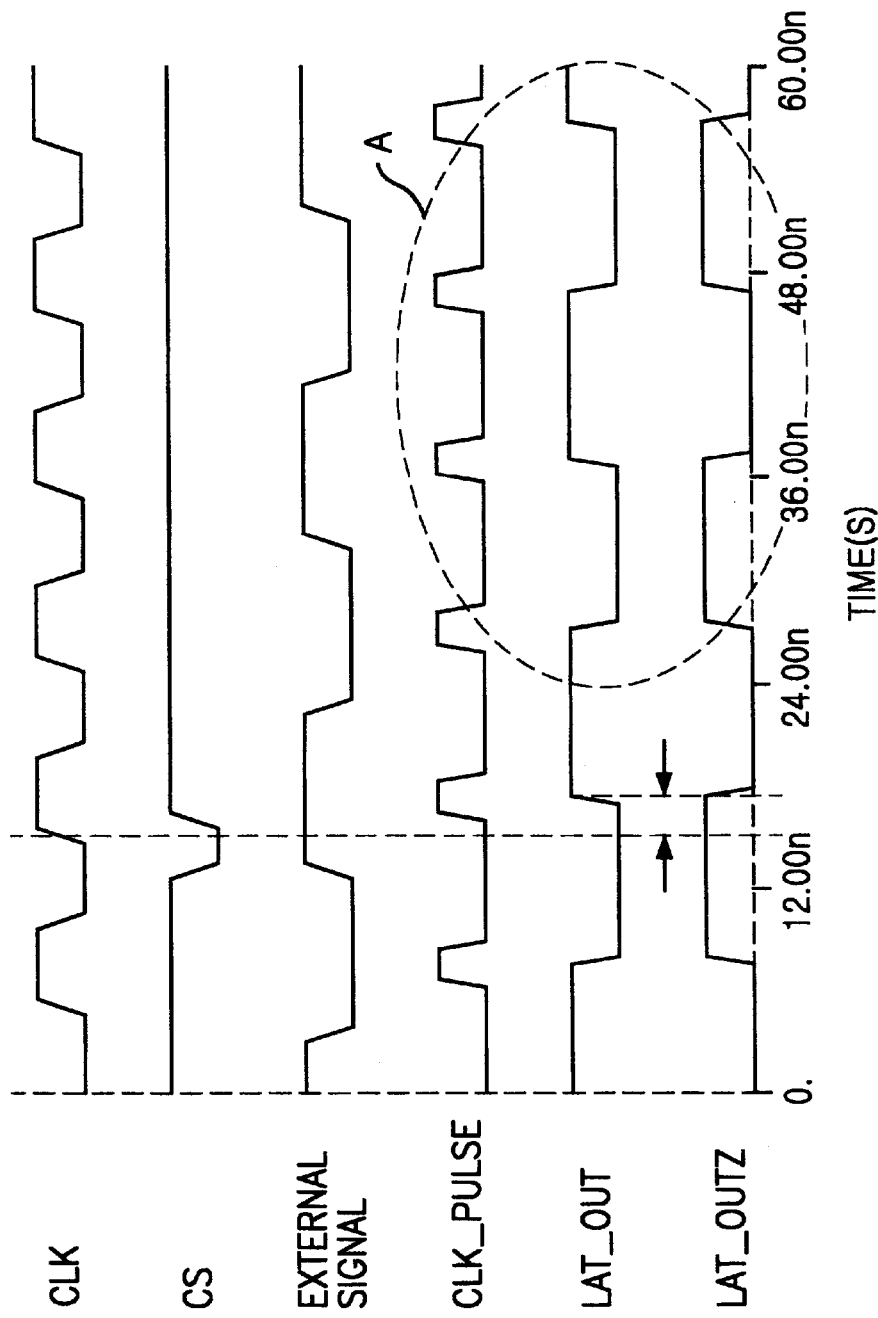
FIG. 2 is a timing chart of signals shown in FIG. 1.
Figure 3:
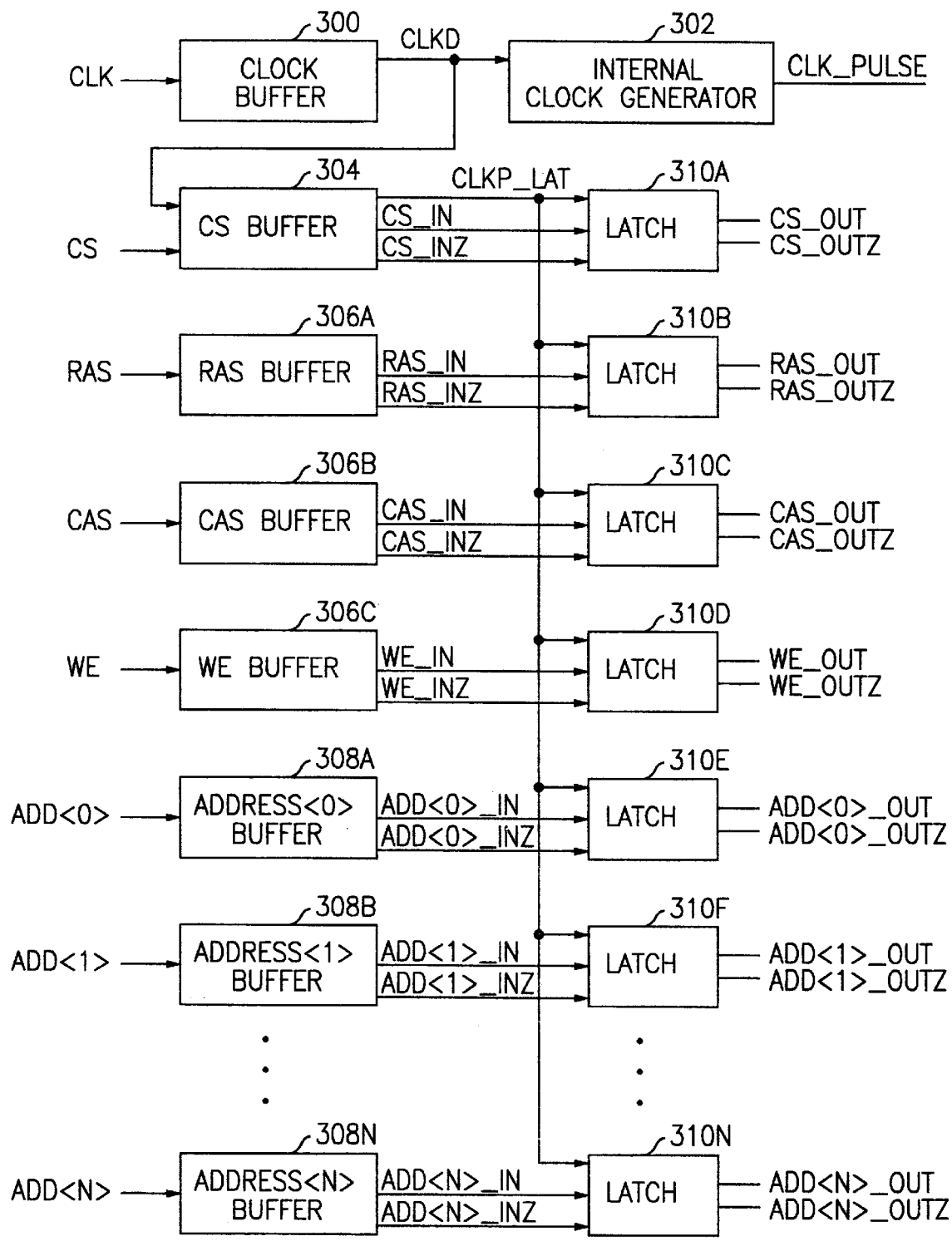
FIG. 3 is a block diagram illustrating a synchronous semiconductor memory device having input buffers and latch circuits in accordance with the present invention.

FIG. 3 is a block diagram illustrating a synchronous semiconductor memory device having input buffers and latch circuits in accordance with the present invention.

Referring to FIG. 3, a clock buffer 300 buffers an external clock signal CLK to output a buffered clock signal CLKD. An internal clock generator 302 generates an internal clock signal CLK_PULSE in response to the buffered clock signal CLKD. A CS buffer 304 receives an external chip select signal CS and the buffered clock signal CLKD to generate a buffered chip select signal CSD, an inverted buffered chip select signal CSDZ and an latch control signal CLKP_LAT.

Additionally, the synchronous semiconductor memory device includes a plurality of external signal input buffers, such as a RAS buffer 306A buffering an external row address strobe signal RAS, a CAS buffer 306B buffering an external column address strobe signal CAS, a WE buffer 306C buffering an external write enable signal WE, and address buffers 308A to 308N buffering external address signals ADD<0> to ADD<N>.

Each of the external signal input buffers 306A to 306C and 308A to 308N generates buffered signals and inverted buffered signals. For example, the address buffer 308A buffers an address signal ADD<0> to output buffered address signal ADD_IN and inverted buffered address signal ADD_INZ.

Each of the latch circuits 310A to 310N latches and outputs each buffered signal, as an internal signal, from the external signal input buffers 304, 306A to 306C and 308A to 308N to the internal logic circuits of the semiconductor memory device in response to the latch control signal CLKP_LAT from the CS buffer 304. For example, the latch circuit 310E latches the buffered address signal ADD<0>_IN and the inverted buffered address signal ADD<0>_INZ and outputs a buffered address signal ADD<0>_OUT and an inverted buffered address signal ADD<0>_OUTZ in response to the latch control signal CLKP_LAT.

As can be seen from FIG. 3, instead of using the internal clock signal CLK_PULSE from the internal clock generator 302, the present invention utilizes the buffered clock signal CLKD from the clock buffer 300 and the chip select signal CS.

Figure 4:
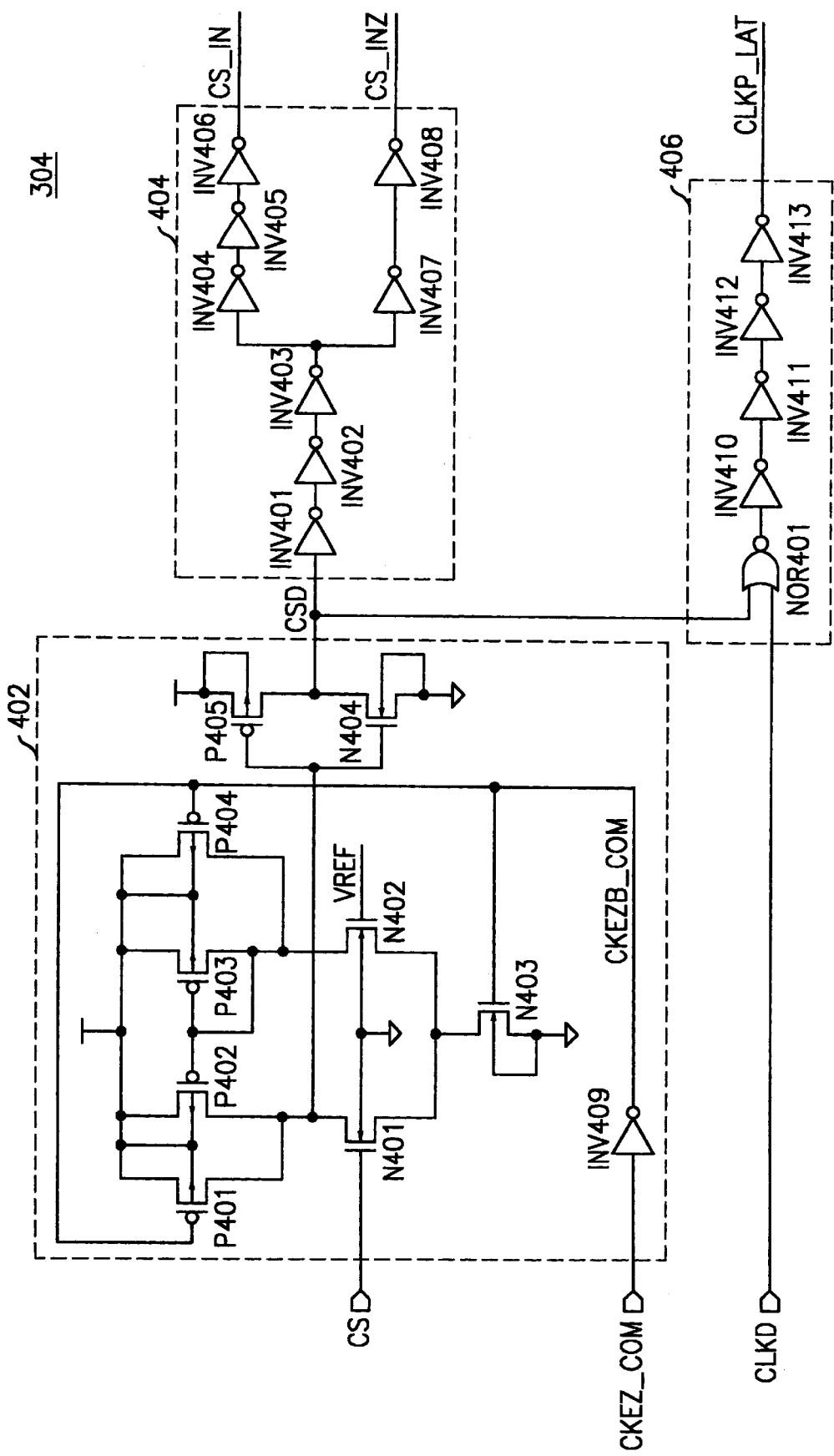
FIG. 4 is a circuit diagram illustrating a CS buffer shown in FIG. 3 as an embodiment of the present invention.

FIG. 4 is a circuit diagram illustrating a CS buffer shown in FIG. 3 as an embodiment of the present invention.

Referring to FIG. 4, the CS buffer 304 includes a voltage regulating portion 402, a delay portion 404, and a latch control signal generating portion 406. The voltage regulating portion 402 receives an external chip select signal CS to output a regulated chip select signal CSD having a voltage level which can be used in the internal logic circuit. The delay portion 404 delays the regulated chip select signal CSD for a predetermined time and outputs a buffered chip select signal CS_IN as a latch input signal and an inverted buffered chip select signal CS_INZ as an inverted latch input signal. The latch control signal generating portion 406 receives the regulated chip select signal CDS and from the voltage generating portion 402 and the buffered clock signal CLKD from the clock buffer 300, and generates the latch control signal CLKP_LAT.

The voltage regulating portion 402 is preferably implemented with a current-mirror type differential amplifier for differentially comparing the external chip select signal CS with a reference voltage signal VREF to output the regulated chip select signal. Also, the voltage regulating portion 402 can be implemented with a cross-couple type differential amplifier. An operation and structure of the current-mirror type differential amplifier and cross-couple type differential amplifier are well known to those skilled in the art, so a detailed description will be omitted for the sake of simplicity in explanation.

The delay portion 404 includes a plurality of inverters INV401 to INV408, serially coupled to each other. The outputs CS_IN and CS_INZ of the delay portion 404 are outputted as the latch input signal and the inverted latch input signal to the latch circuit 310A, respectively.

The latch control signal generating portion 406 includes a NOR gate NOR401 for NORing the regulated chip select signal CSD and the buffered clock signal CLKD, and a plurality of inverters INV410 to INV413, serially coupled to each other, for improving a fan-out characteristic. A drivability of the latch control signal CLKP_LAT is increased through the inverters INV410 to INV413. At this time, only when both the regulated chip select signal CSD and the buffered clock signal CLKD are low, the latch control signal CLKP_LAT is activated to a high level. On the contrary, when either the regulated chip select signal CSD or the buffered clock signal CLKD are high, the latch control signal CLKP_LAT is inactivated to a low level.

Furthermore, as shown in FIG. 4, in case where the voltage regulating portion 402 is implemented with a dynamic type amplifier by using an external control signal CKEZ_COM, an input of the chip select signal can be reserved and a current consumption can be reduced during a self-refresh mode.

The dynamic type amplifier includes: a PMOS transistor P402 having a source coupled to a power supply voltage; a PMOS transistor P403 having a source coupled to the power supply voltage and a gate coupled to a gate of the PMOS transistor P402 and a drain coupled to its own gate; a NMOS transistor N401 having a drain coupled to a drain of the PMOS transistor P402 and a gate receiving the chip select signal CS; a NMOS transistor N402 having a drain coupled to the drain of the PMOS transistor P403 and a gate receiving the reference voltage signal VREF and a source coupled to a source of the NMOS transistor N401; a NMOS transistor N403 having a drain coupled to the source of the NMOS transistor N402 and a source coupled to a ground voltage and a gate receiving an inverted external control signal CKEZB_COM; an inverter INV403 inverting the external control signal CKEZ_COM; a PMOS transistor P401 having a source coupled to the power supply voltage, a drain coupled to the drain of the PMOS transistor P402 and a gate receiving the inverted external control signal CKEZB_COM; a PMOS transistor P404 having a source coupled to the power supply voltage, a drain coupled to the drain of the PMOS transistor P403 and a gate receiving the inverted external clock signal CKEZB_COM.

Figure 5:
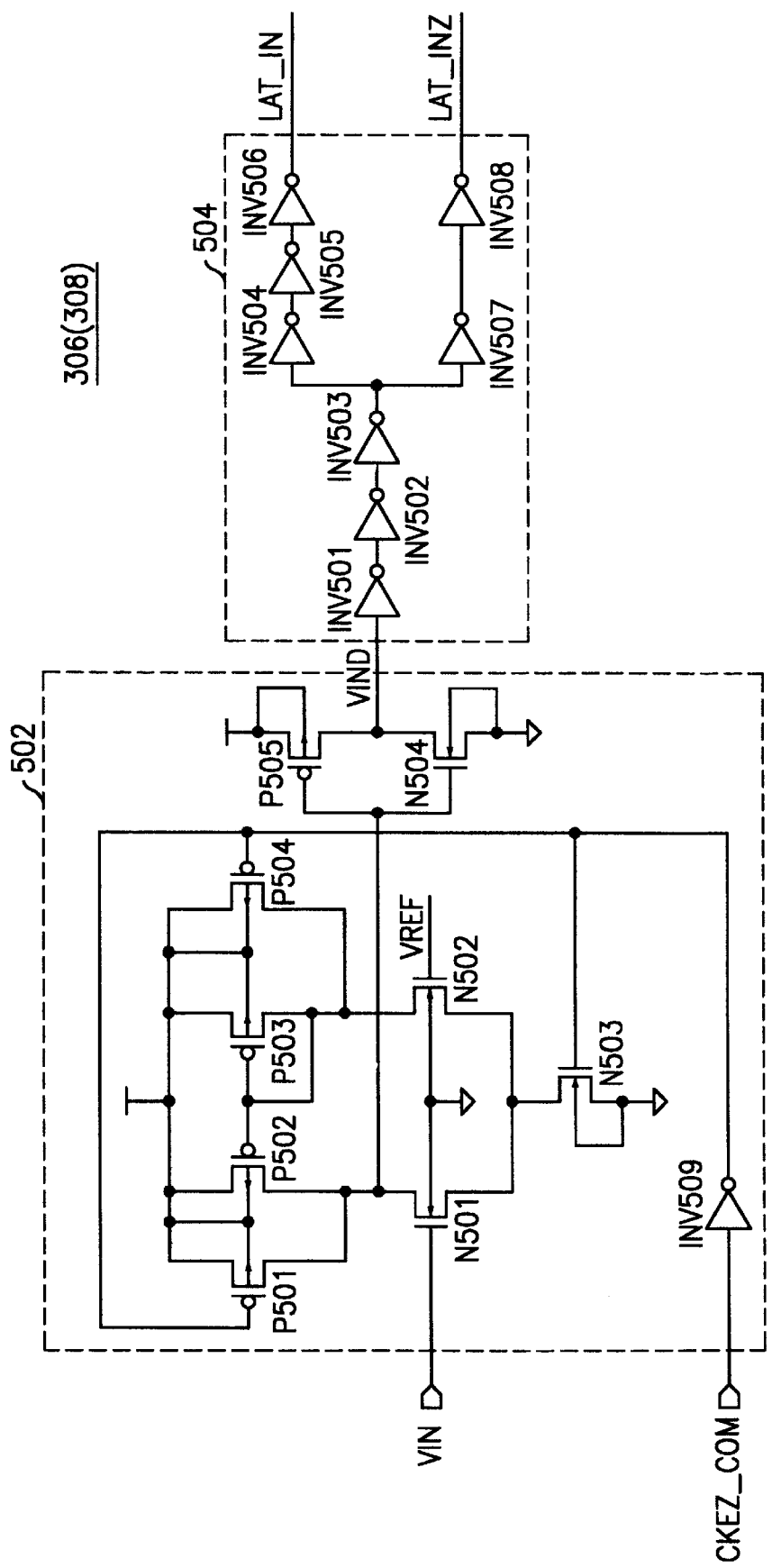
FIG. 5 is a circuit diagram illustrating an input buffer shown in FIG. 3 as an embodiment of the present invention.

FIG. 5 is a circuit diagram illustrating external signal input buffer as an embodiment of the present invention.

The external signal input buffer shown in FIG. 5 is applicable to other control signals except the chip select signal. That is, the external signal input buffer is applicable to the RAS buffer 306A, the CAS buffer 106B, the WE buffer 306C, and the address buffers 108A to 108N.

A structure of the external signal input buffer shown in FIG. 5 is similar to that of the CS buffer 304, except the latch control signal generating portion 406. The external signal input buffer includes a voltage regulating portion 502 and a delay portion 504. The voltage regulating portion 502 receives an external signal VIN to output a regulated signal VIND having a voltage level which can be used in the internal logic circuit. Here, the external signal includes a row address strobe signal RAS, a column address strobe signal CAS, a write enable signal WE, and address signals ADD<0> to ADD<N>.

The delay portion 504 delays the regulated signal VIND for a predetermined time to output a buffered signal LAT_IN as a latch input signal and an inverted buffered signal LAT_INZ as an inverted latch input signal.

The voltage regulating portion 502 is preferably implemented with a current-mirror type differential amplifier for differentially comparing the external signal VIN with a reference voltage signal VREF to output a regulated voltage signal. Furthermore, the voltage regulating portion 502 can also be implemented with a cross-coupled type differential amplifier. An operation and structure of the current-mirror type differential amplifier and cross-couple type differential amplifier are well known to those skilled in the art, so a detailed description will be omitted for the sake of simplicity in explanation.

The delay portion 504 includes a plurality of inverters INV501 to INV808, serially coupled to each other. The output signals LAT_IN and LAT_INZ from the delay portion 504 are outputted to the corresponding latch circuits 310B to 310N, respectively.

In case where the voltage regulating portion 502 is implemented with a dynamic type amplifier by using the external control signal CKEZ_COM, an input of the external signal can be reserved and a current consumption can be reduced during a self-refresh mode. A structure of the dynamic type amplifier shown in FIG. 5 is the same as that in FIG. 4.

FIGS. 6 to 9 are circuit diagrams illustrating the latch circuits shown in FIG. 3 as embodiments of the present invention.

Figure 6:
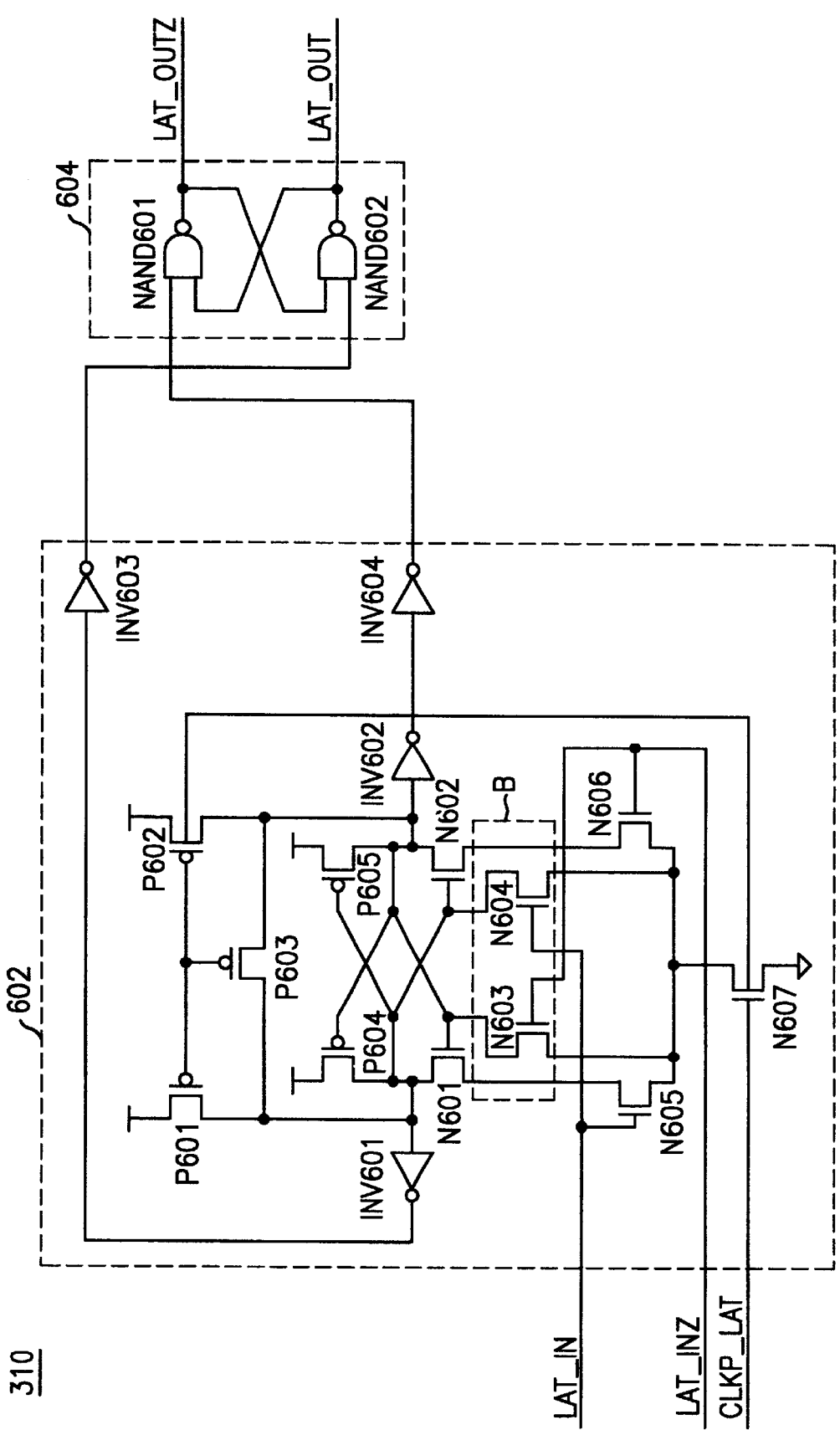
FIGS. 6 to 9 are circuit diagrams illustrating latch circuits shown in FIG. 3 as embodiments of the present invention.

Referring to FIG. 6, the latch circuit is applicable to all the latch circuits 310A to 310N shown in FIG. 3. Each latch circuit 310A to 310N includes a signal transfer portion 602 and a latching portion 604. The signal transfer portion 602 receives and transfers the buffered signal LAT_IN and the inverted buffered signal LAT_INZ from the external signal input buffer in response to the latch control signal CLKP_LAT. The latching portion 604 latches and outputs the buffered signal LAT_OUT and the inverted buffered signal LAT_OUTZ to the internal logic circuits.

At this time, the signal transfer portion 602 is implemented with a cross-couple type differential amplifier and a current-type differential amplifier. Furthermore, in case of a dynamic cross-couple type differential amplifier, the signal transfer portion 602 further includes a pair of NMOS transistors N604 and N604 cross-coupled to each other, as shown in section B of FIG. 6. The pair of NMOS transistors N603 and N604 transits the level of the output signals LAT_OUT and LAT_OUTZ according to the level transition of the latch input signals LAT_IN and LAT_INZ.

The latching portion 604 includes two NAND gates NAND601 and NAND602. The first NAND gate NAND601 has an input terminal receiving the buffered signal from the signal transfer portion 602, and the second NAND gate NAND602 receives the inverted buffered signal from the signal transfer portion 602 and an output signal from the first NAND gate NAND601, an output terminal thereof being coupled to another input terminal of the first NAND gate NAND601.

Figure 7:
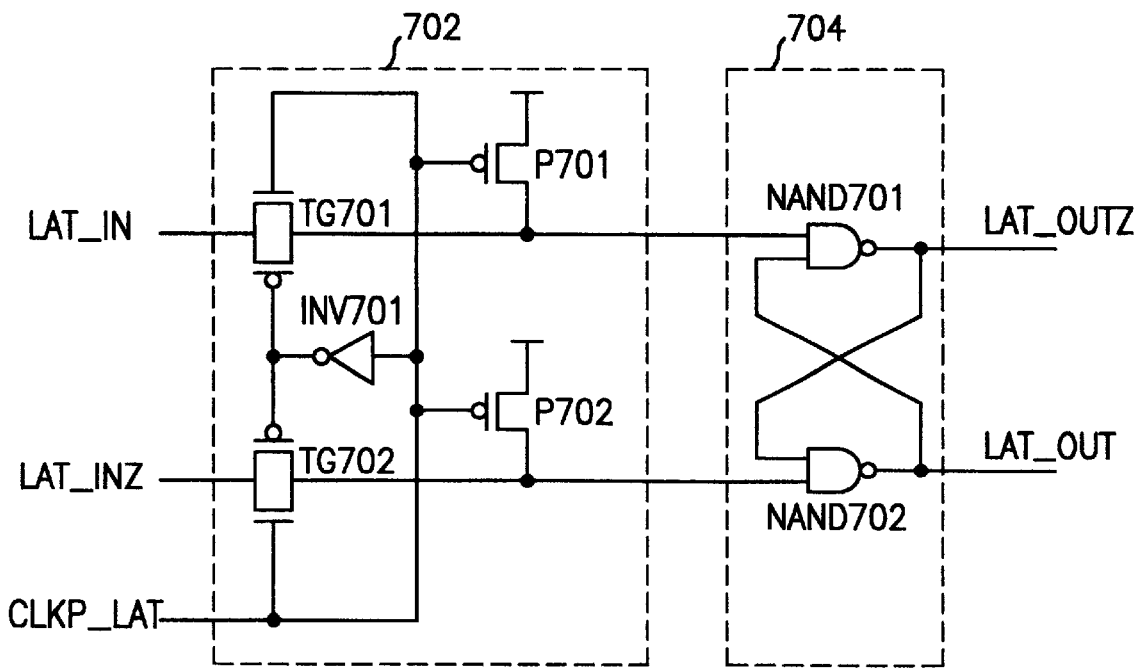

FIG. 7 is a circuit diagram illustrating the latch circuit shown in FIG. 3 as a second embodiment of the present invention.

Referring to FIG. 7, the latch circuit includes a signal transfer portion 702 and a latching portion 704. The signal transfer portion 702 controls the transfer of the latch input signals LAT_IN and LAT_INZ in response to the latch control signal CLKP_LAT. The signal transfer portion 702 includes a first pass gate TG701 for transferring the buffered signal LAT_IN in response to the latch control signal CLKP_LAT; a second pass gate TG702 for transferring the inverted buffered signal LAT_INZ in response to the latch control signal CLKP_LAT; an inverter INV701 having an input terminal receiving the latch control signal and an output terminal coupled to the first and second pass gates TG701 and TG702; a first PMOS transistor P701 having a source coupled to a power supply voltage, a drain coupled to an output terminal of the first gate TG701, and a gate receiving the latch control signal CLKP_LAT; a second PMOS transistor P702 having a source coupled to the power supply voltage, a drain coupled to an output terminal of the second pass gate TG702, a gate receiving the latch control signal CLKP_LAT.

The latching portion 704 includes a first NAND gate NAND701 having an input terminal receiving the buffered signal from the first pass gate TG701; and a second NAND gate NAND702 receiving the inverted buffered signal from the signal transfer portion 702 and an output signal from the first NAND gate NAND701, an output terminal thereof being coupled to of the first NAND gate NAND701.

When the latch control signal CLKP_LAT is high, the pass gates TG701 and TG702 are turned on to transfer the latch input signals LAT_IN and LAT_INZ. When the latch control signal CLKP_LAT is low, the PMOS transistors P701 and P702 are turned on so that the power supply voltage is supplied to the output terminals of the pass gates TG701 and TG702, thereby outputting a high level signal to the internal logic circuits.

Figure 8:
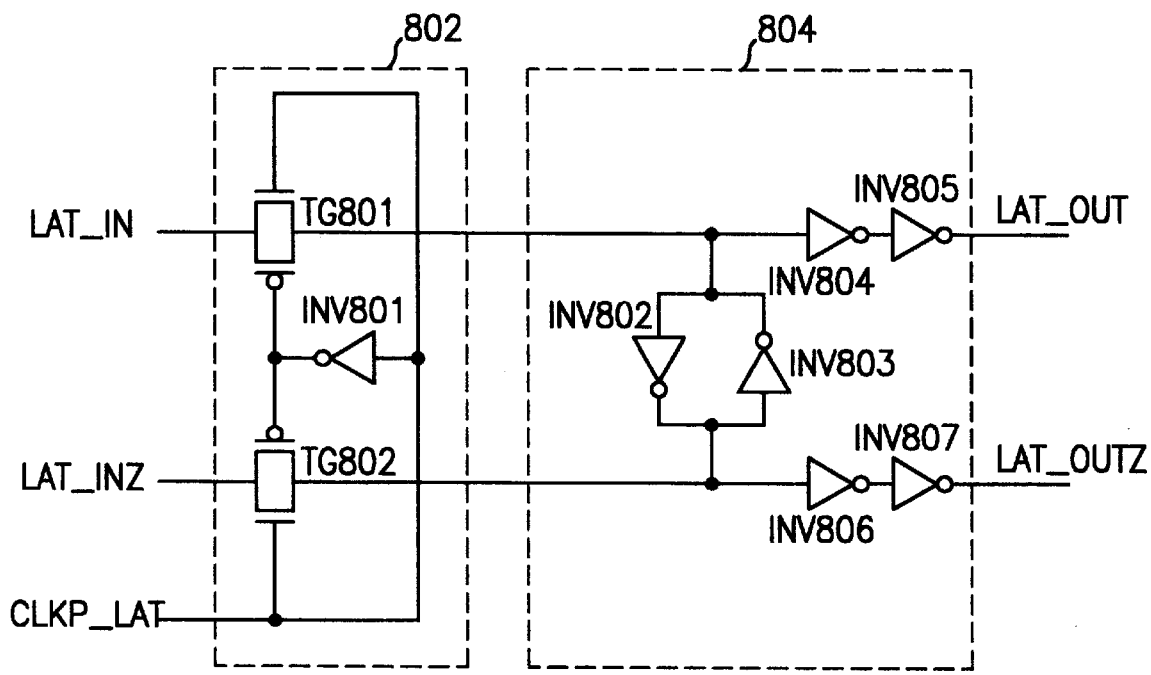

FIG. 8 is a circuit diagram illustrating a latch circuit shown in FIG. 3 as a third embodiment of the present invention.

Referring to FIG. 8, the latch circuit includes a signal transfer portion 802 for transferring the latch input signals LAT_IN and LAT_INZ in response to the latch control signal CLKP_LAT and a latching portion 804 for latching and outputting the output signals from the signal transfer portion 802.

The signal transfer portion 802 includes a first pass gate TG801 for transferring the latch input signal LAT_IN in response to the latch control signal CLKP_LAT; a second pass gate TG802 for transferring the inverted latch input signal LAT_INZ in response to the latch control signal CLKP_LAT; and an inverter INV801 having an input terminal receiving the latch control signal CLKP_LAT and an output terminal coupled to the first and second pass gates TG801 and TG802.

The latching portion 804 includes a first inverter INV802 having an input terminal coupled to the output terminal of the first pass gate TG801 and an output terminal coupled to an output terminal of the second pass gate TG802; a second inverter INV803 having an input terminal coupled to the output terminal of the second pass gate TG802 and an output terminal coupled to the output terminal of the first pass gate TG801; a plurality of third inverters INV804 and INV805, serially coupled to the output terminal of the pass gate TG801, for outputting the buffered signal LAT_OUT; and a plurality of fourth inverters INV806 and INV807, coupled to the output terminal of the second pass gate TG802, for outputting the inverted latched signal LAT_OUTZ.

When the latch control signal CLKP_LAT is high, the pass gates TG801 and TG802 are turned on to transmit the latch input signals LAT_IN and LAT_INZ. Then, the latch input signals LAT_IN and LAT_INZ are latched and outputted to the internal logic circuits through the latching portion 804.

Figure 9:
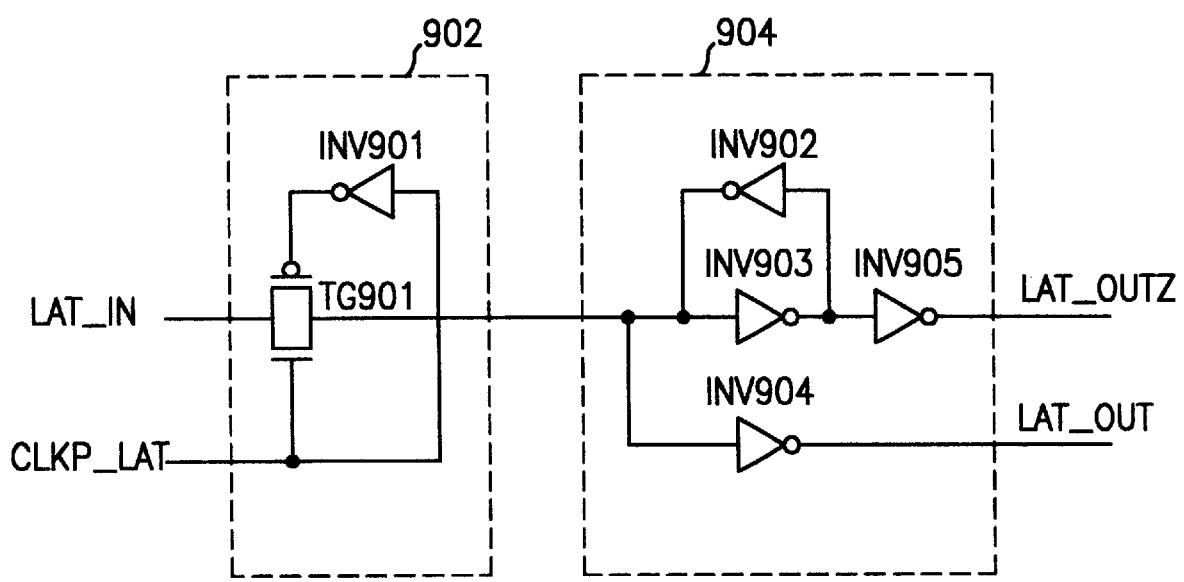

FIG. 9 is a circuit diagram illustrating a latch circuit shown in FIG. 3 as a fourth embodiment of the present invention.

Referring to FIG. 9, the latch circuit includes a signal transfer portion 902 and a latching portion 904. The signal transfer portion 902 includes a pass gate TG901 for transferring the buffered signal from the input buffers in response to the latch control signal CLKP_LAT; and an inverter INV901 having an input terminal receiving the latch control signal CLKP_LAT and an output terminal coupled to the pass gate TG901.

The latching portion 904 includes a second inverter INV903 having an input terminal coupled to an output terminal of the pass gate TG901; a third inverter INV902 having an input terminal coupled to an output terminal of the second inverter INV903 and an output terminal coupled to the input terminal of the second inverter INV903; a fourth inverter INV904 receiving the output signal from the second inverter INV903 and outputting buffered signal LAT_OUT; and a fifth inverter INV905 receiving the output signal from the signal transfer portion 902 and outputting the inverted buffered signal LAT_OUTZ.

FIG. 10 is a timing chart of the signals shown in FIG. 3.

Referring to FIG. 10, in case where the external clock signal CLK is at a rising edge and the chip select signal CS is low, the latch control signal CLKP_LAT is generated. Then, the output signals LAT_OUT and LAT_OUTZ from the latch circuits are outputted in response to the latch control signal CLKP_LAT. Since the latch control signal CLKP_LAT is controlled only by the chip select signal CS, although the external signal changes, the output signals of the latch circuits is not outputted to the internal logic circuits of the semiconductor memory device.

As described above, the latch circuits in the synchronous semiconductor memory device are controlled by the internal chip select signal from the CS buffer, not from the internal clock generator, so that the delay time required to transfer the external signals to the internal logic circuits can be remarkably decreased, and an unnecessary power consumption can be prevented.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A synchronous semiconductor memory device having a plurality of external signal input buffer and a plurality of latch circuits, comprising:

a clock buffer means for receiving an external clock signal to generate a buffered clock signal;

a chip select buffer means for receiving an external chip select signal and the buffered clock signal from said clock buffer means to generate a buffered chip select signal, an inverted buffered chip select signal and a latch control signal, wherein the latch control signal is activated when the external clock signal is at the rising edge and the external chip select signal is low;

a plurality of external signal buffer means for receiving external signals to generate buffered signals and inverted buffered signals; and a plurality of latch means for latching and outputting the buffered signals and the inverted buffer signal to an internal logic circuit in response to the latch control signal.

2. The synchronous semiconductor memory device as recited in claim 1, wherein the external signals includes a row address strobe signal, a column address strobe signal, a write enable signal, and address signal.

3. The synchronous semiconductor memory device as recited in claim 1, wherein said chip select buffer means includes:

a voltage regulating means for receiving the external chip select signal and a reference voltage signal to generate a regulated chip select signal;

a delay means for delaying the regulated chip select signal for a predetermined time and outputting the buffered chip select signal and the inverted buffered chip select signal; and a latch control signal generating means for receiving the regulated chip select signal and the buffered clock signal to generate the latch control signal.

4. The synchronous semiconductor memory device as recited in claim 3, wherein said voltage regulating means is one of a current-mirror type differential amplifier and a cross-couple type differential amplifier for differentially comparing the external chip select signal with the reference voltage signal.

5. The synchronous semiconductor memory device as recited in claim 3, wherein said voltage regulating means is a dynamic type amplifier, the dynamic type amplifier including:

a first PMOS transistor having a source coupled to a power supply voltage;

a second PMOS transistor having a source coupled to the power supply voltage and a gate coupled to a gate of the first PMOS transistor and a drain coupled to the gate;

a first NMOS transistor having a drain coupled to a drain of the first PMOS transistor and a gate receiving the external chip select signal;

a second NMOS transistor having a drain coupled to the drain of the second PMOS transistor and a gate receiving the reference voltage signal and a source coupled to a source of the first NMOS transistor;

a third NMOS transistor having a drain coupled to the source of the second NMOS transistor and a source coupled to a ground voltage and a gate receiving an inverted external control signal;

an inverter INV403 inverting the external control signal CKEZ_COM;

a third PMOS transistor P401 having a source coupled to the power supply voltage, a drain coupled to the drain of the first PMOS transistor P402 and a gate receiving the inverted external control signal CKEZB_COM; and a fourth PMOS transistor P404 having a source coupled to the power supply voltage, a drain coupled to the drain of the second PMOS transistor P403 and a gate receiving the inverted external control signal CKEZB_COM.

6. The synchronous semiconductor memory device as recited in claim 3, wherein said delay means includes a plurality of inverters, each inverter being serially coupled to each other.

7. The synchronous semiconductor memory device as recited in claim 3, wherein said latch control signal generating means includes:

a NOR gate for NORing the regulated chip select signal from said voltage regulating means and the buffered clock signal from said clock buffer means; and a plurality of inverters for receiving an output signal from the NOR gate to output the latch control signal.

8. The synchronous semiconductor memory device as recited in claim 1, wherein each of the plurality of said external signal buffer means includes:

a voltage regulating means for receiving the external signal and a reference voltage signal to generate a regulated signal; and a delay means for delaying the regulated signal from said voltage regulating means for a predetermined time and outputting the buffered signal and the inverted buffered signal.

9. The synchronous semiconductor memory device as recited in claim 8, wherein said voltage regulating means is one of a current-mirror type differential amplifier and a cross-couple type differential amplifier.

10. The synchronous semiconductor memory device as recited in claim 8, wherein said delay means includes a plurality of inverters, each inverter being serially coupled to each other.

11. The synchronous semiconductor memory device as recited in claim 1, wherein each of the plurality of said latch means includes:

a signal transfer mean for receiving and transferring the buffered signal and the inverted buffered signal from said buffer means in response to the latch control signal; and a latching means for latching and outputting the buffered signal and the inverted buffered signal to the internal logic circuit.

12. The synchronous semiconductor memory device as recited in claim 11, wherein said signal transfer means is one of a current-mirror type differential amplifier and a cross-couple type differential amplifier.

13. The synchronous semiconductor memory device as recited in claim 12, wherein said latching means includes:

a first NAND gate having an input terminal receiving the buffered signal from said signal transfer means; and a second NAND gate receiving the inverted buffered signal from said signal transfer means and an output signal from the first NAND gate, an output terminal thereof being coupled to another input terminal of the first NAND gate.

14. The synchronous semiconductor memory device as recited in claim 11, wherein said signal transfer means includes:

a first pass gate for transferring the buffered signal in response to the latch control signal;

a second pass gate for transferring the inverted buffered signal in response to the latch control signal;

an inverter having an input terminal receiving the latch control signal and an output terminal coupled to the first and second pass gates;

a first PMOS transistor having a source coupled to a power supply voltage, a drain coupled to an output terminal of the first pass gate, and a gate receiving the latch control signal; and a second PMOS transistor having a source coupled to the power supply voltage, a drain coupled to an output terminal of the second pass gate, and a gate receiving the latch control signal.

15. The synchronous semiconductor memory device as recited in claim 14, wherein said latching means includes:

a first NAND gate having an input terminal receiving the buffered signal from said signal transfer means; and a second NAND gate receiving the inverted buffered signal from said signal transfer means and an output signal from the first NAND gate, an output terminal thereof being coupled to another input terminal of the first NAND gate.

16. The synchronous semiconductor memory device as recited in claim 11, wherein said signal transfer means includes:

a first pass gate for transferring the buffered signal in response to the latch control signal;

a second pass gate for transferring the inverted buffered signal in response to the latch control signal; and an inverter having an input terminal receiving the latch control signal and an output terminal coupled to the first and second pass gates.

17. The synchronous semiconductor memory device as recited in claim 16, wherein said latching means includes:

a first inverter having an input terminal coupled to an output terminal of the first pass gate, and an output terminal coupled to an output terminal of the second pass gate;

a second inverter having an input terminal coupled to an output terminal of the second pass gate, and an output terminal coupled to the output terminal of the first pass gate;

a plurality of third inverters, coupled to the output terminal of the first pass gate, outputting the buffered signal; and a plurality of fourth inverters, coupled to the output terminal of the second pass gate, outputting the inverted buffered signal.

18. The synchronous semiconductor memory device as recited in claim 11, wherein said signal transfer means includes:

a pass gate receiving the buffered signal and outputting the buffered signal in response to the latch control signal; and an inverter having an input terminal receiving the latch control signal and an output terminal coupled to the pass gate.

19. The synchronous semiconductor memory device as recited in claim 18, wherein said latching means includes:

a second inverter having an input terminal coupled to an output terminal of the pass gate;

a third inverter having an input terminal coupled to an output terminal of the second inverter, and an output terminal coupled to the input terminal of the second inverter;

a fourth inverter receiving the output signal from the second inverter and outputting the buffered signal; and a fifth inverter receiving the output signal from said signal transfer means and outputting the inverted buffered signal.

* * * * *